US010508778B2

(12) United States Patent
Kuriki et al.

(10) Patent No.: US 10,508,778 B2
(45) Date of Patent: Dec. 17, 2019

(54) LIGHT-EMITTING DEVICE

(71) Applicants: CITIZEN ELECTRONICS CO., LTD., Fujiyoshida-shi, Yamanashi (JP); CITIZEN WATCH CO., LTD., Tokyo (JP)

(72) Inventors: Shingo Kuriki, Fujiyoshida (JP); Arata Shimozawa, Fujiyoshida (JP)

(73) Assignees: Citizen Electronics Co., Ltd., Yamanashi (JP); Citizen Watch Co., Ltd., Tokyo (JP)

(*) Notice: Subject to any disclaimer, the term of this patent is extended or adjusted under 35 U.S.C. 154(b) by 359 days.

(21) Appl. No.: 15/326,357

(22) PCT Filed: Jul. 15, 2015

(86) PCT No.: PCT/JP2015/070319
§ 371 (c)(1),
(2) Date: Jan. 13, 2017

(87) PCT Pub. No.: WO2016/010094
PCT Pub. Date: Jan. 21, 2016

(65) Prior Publication Data
US 2017/0211761 A1 Jul. 27, 2017

(30) Foreign Application Priority Data
Jul. 15, 2014 (JP) .................... 2014-145271

(51) Int. Cl.
*F21S 2/00* (2016.01)
*F21V 29/89* (2015.01)
(Continued)

(52) U.S. Cl.
CPC ............... *F21S 2/005* (2013.01); *F21K 9/00* (2013.01); *F21V 19/002* (2013.01); *F21V 23/06* (2013.01);
(Continued)

(58) Field of Classification Search
CPC ........ F21S 2/005; F21V 29/89; F21V 19/002; F21V 23/06; F21K 9/00; F21Y 2105/18;
(Continued)

(56) References Cited

U.S. PATENT DOCUMENTS 5,177,593 A * 1/1993 Abe .......................... G09F 9/33
257/100
2004/0065894 A1 4/2004 Hashimoto et al.
(Continued)

FOREIGN PATENT DOCUMENTS

CN 101707234 A 5/2010
CN 103427010 A 12/2013
(Continued)

OTHER PUBLICATIONS

Japanese International Preliminary Report on Patentability with English language translation for International Application No. PCT/JP2015/070319, dated Jan. 19, 2017, 10 pages.
(Continued)

*Primary Examiner* — Mary Ellen Bowman
(74) *Attorney, Agent, or Firm* — RatnerPrestia

(57) ABSTRACT

Provided is a light-emitting device in which a light-emitting region is increased in size without decreasing the yield. This light-emitting device includes a central light-emitting unit, and a plurality of peripheral light-emitting units arranged to fill a periphery of the central light-emitting unit, wherein each of the central light-emitting unit and the peripheral light-emitting units includes a substrate and light-emitting elements mounted on the substrate, and an area of the light-emitting region of each of the peripheral light-emitting units is equal to or smaller than an area of the light-emitting region of the central light-emitting unit.

20 Claims, 9 Drawing Sheets

(51) Int. Cl.
  *F21V 19/00*      (2006.01)
  *F21V 23/06*      (2006.01)
  *F21K 9/00*       (2016.01)
  *F21Y 105/18*     (2016.01)
  *F21Y 113/13*     (2016.01)
  *F21Y 115/10*     (2016.01)
  *F21Y 107/50*     (2016.01)
  *H01L 25/075*     (2006.01)
  *F21Y 107/60*     (2016.01)

(52) U.S. Cl.
  CPC ........... *F21V 29/89* (2015.01); *F21Y 2105/18* (2016.08); *F21Y 2107/50* (2016.08); *F21Y 2107/60* (2016.08); *F21Y 2113/13* (2016.08); *F21Y 2115/10* (2016.08); *H01L 25/0753* (2013.01)

(58) Field of Classification Search
  CPC .............. F21Y 2107/60; F21Y 2113/13; F21Y 2115/10; F21Y 2107/50; H01L 25/0753
  See application file for complete search history.

(56) References Cited

U.S. PATENT DOCUMENTS

| | | | |
|---|---|---|---|
| 2009/0027913 A1 | 1/2009 | Baranski | |
| 2010/0097811 A1 | 4/2010 | Betsuda | |
| 2012/0319158 A1 | 12/2012 | Jin et al. | |
| 2012/0320563 A1 | 12/2012 | Betsuda | |
| 2013/0026923 A1* | 1/2013 | Athalye | H05B 33/083 315/113 |
| 2013/0234177 A1* | 9/2013 | Chiu | H01L 25/0753 257/91 |

FOREIGN PATENT DOCUMENTS

| | | | | |
|---|---|---|---|---|
| EP | 2730834 A1 * | 5/2014 | | F21S 2/005 |
| JP | 2003152225 A | 5/2003 | | |
| JP | 2006156603 | 6/2006 | | |
| JP | 2009509306 | 3/2009 | | |
| JP | 2009158188 A | 7/2009 | | |
| JP | 3156826 | 1/2010 | | |
| JP | 2010093094 | 4/2010 | | |
| JP | 2010097890 | 4/2010 | | |
| JP | 2011129381 | 6/2011 | | |
| JP | 2013038018 | 2/2013 | | |
| JP | 2013239504 A | 11/2013 | | |
| JP | 2013251444 | 12/2013 | | |
| JP | 201436202 A | 2/2014 | | |
| JP | 2014120708 | 6/2014 | | |

OTHER PUBLICATIONS

International Search Report and Written Opinion for International Application PCT/JP2015/070319, dated Aug. 11, 2015, 6 pages.
Chinese Office Action for Chinese Application No. 201580038459.3, dated Jul. 3, 2018, with translation, 14 pages.

* cited by examiner

LIGHT-EMITTING DEVICE

CROSS REFERENCE TO RELATED APPLICATIONS

This is the U.S. National Phase application of PCT International Application No. PCT/JP2015/070319, filed Jul. 15, 2015 and claims priority to Japanese Patent Application No. 2014-145271, filed Jul. 15, 2014, the disclosures of these applications being incorporated herein by reference in their entireties for all purposes.

FIELD OF THE INVENTION

The present invention relates to a light-emitting device.

BACKGROUND OF THE INVENTION

In recent years, a light-emitting device using a light-emitting diode (LED) as a light-emitting element is widely used for a lighting apparatus and the like. For example, a lighting apparatus using an LED unit having a strip-shaped LED substrate and a plurality of LEDs arranged along an arrangement line of the LED substrate, in which a connector is provided at a position away from the arrangement line at an end part of the LED substrate, is described in Patent Literature 1.

CITATIONS LIST

Patent Literature

Patent Literature 1: Japanese Unexamined Patent Publication (Kokai) No. 2013-251444

SUMMARY OF INVENTION

For many illumination purposes, a circular large light-emitting region having a large amount of light at the central part which is an optical axis is desired. However, for example, in a light-emitting device using a light-emitting element, such as an LED, it is difficult to simply increase the size of a light-emitting region due to decreasing of yield. Patent Literature 1 describes a plurality of LED units that are curved so as to have partially arc shapes are connected to one another to form an annular light-emitting region, but the central part does not become bright by the method, and a uniform disc-shaped light-emitting region is not formed.

It is an object of the present invention to provide a light-emitting device in which a light-emitting region is increased in size without decreasing the yield and the amount of light of the central part is increased, compared to the case without the present structure.

Provided is a light-emitting device including a central light-emitting unit, and a plurality of peripheral light-emitting units arranged to fill a periphery of the central light-emitting unit, wherein each of the central light-emitting unit and the peripheral light-emitting units includes a substrate and light-emitting elements mounted on the substrate, and an area of the light-emitting region of each of the peripheral light-emitting units is equal to or smaller than an area of the light-emitting region of the central light-emitting unit.

Preferably, in the above light-emitting device, the plurality of peripheral light-emitting units includes peripheral light-emitting units having different emission color.

Preferably, in the above light-emitting device, the peripheral light-emitting units having the different emission colors are connected in parallel to an external power supply.

Preferably, in the above light-emitting device, each of the central light-emitting unit and the peripheral light-emitting units includes a sealing resin that seals the light-emitting elements, and a resin frame that fixes the sealing resin, the light-emitting region of the central light-emitting unit is a region covered with the sealing resin of the central light-emitting unit, and the light-emitting region of each of the peripheral light-emitting units is a region covered with the sealing resin of the peripheral light-emitting unit.

Preferably, in the above light-emitting device, the resin frame of each of the peripheral light-emitting units is not provided on end parts that face adjacent peripheral light-emitting units.

Preferably, in the above light-emitting device, the resin frame of each of the peripheral light-emitting units is not provided also on an end part that faces the central light-emitting unit.

Preferably, in the above light-emitting device, the sealing resin of the central light-emitting unit has a disc shape, and sealing resins in a region filled with the central light-emitting unit and the plurality of peripheral light-emitting units have a disc shape as a whole.

Preferably, in the above light-emitting device, each of the central light-emitting unit and the peripheral light-emitting units includes a ceramic circuit substrate as the substrate.

Preferably, in the above light-emitting device, the light-emitting elements of the central light-emitting unit and the light-emitting elements of the plurality of peripheral light-emitting units are mounted on the substrates at relatively different heights.

According to the above light-emitting device, a light-emitting region can be increased in size without decreasing the yield and the amount of light of the central part can be increased, compared to the case without the present structure.

DESCRIPTION OF EMBODIMENTS

Hereinafter, with reference to the accompanying drawings, light-emitting devices will be explained in detail. However, it should be noted that the present invention is not limited to the drawings or the embodiments described below.

Figure 1A:
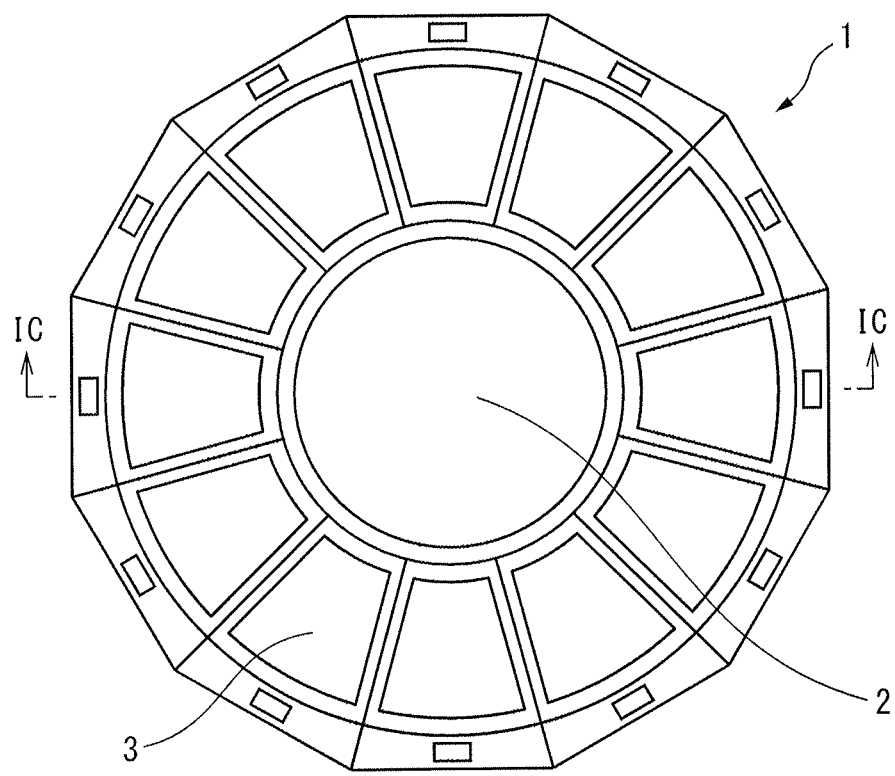
FIG. 1A is a top view of a light-emitting device 1.
Figure 1B:
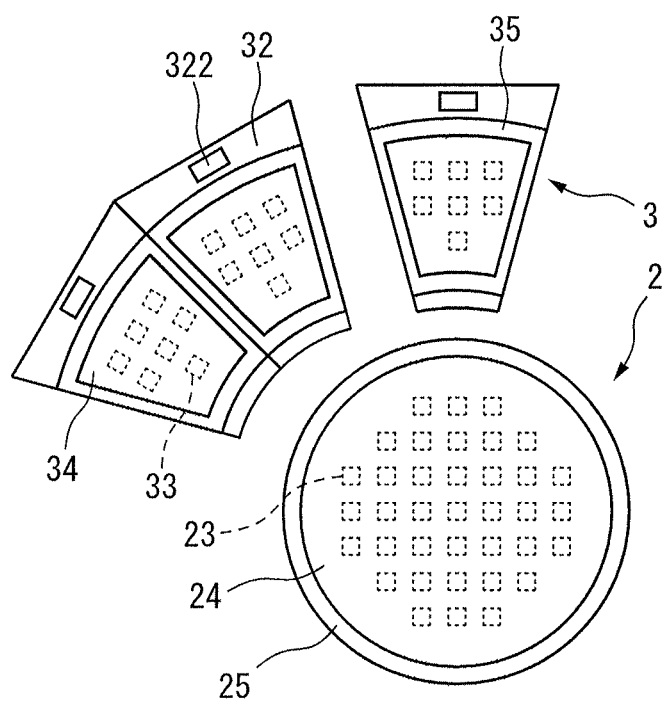
FIG. 1B is an exploded view of a light-emitting device 1.
Figure 1C:
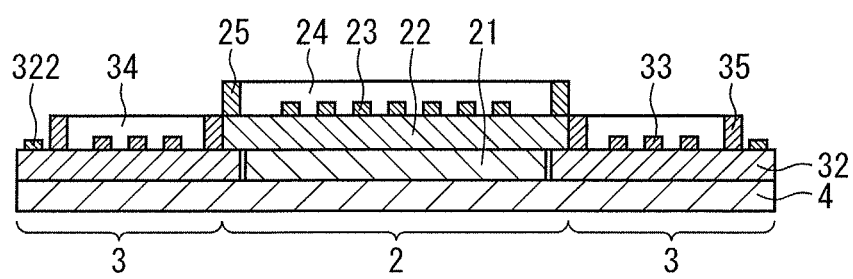
FIG. 1C is a cross-sectional view taken along the line IC-IC of a light-emitting device 1.
Figure 2A:
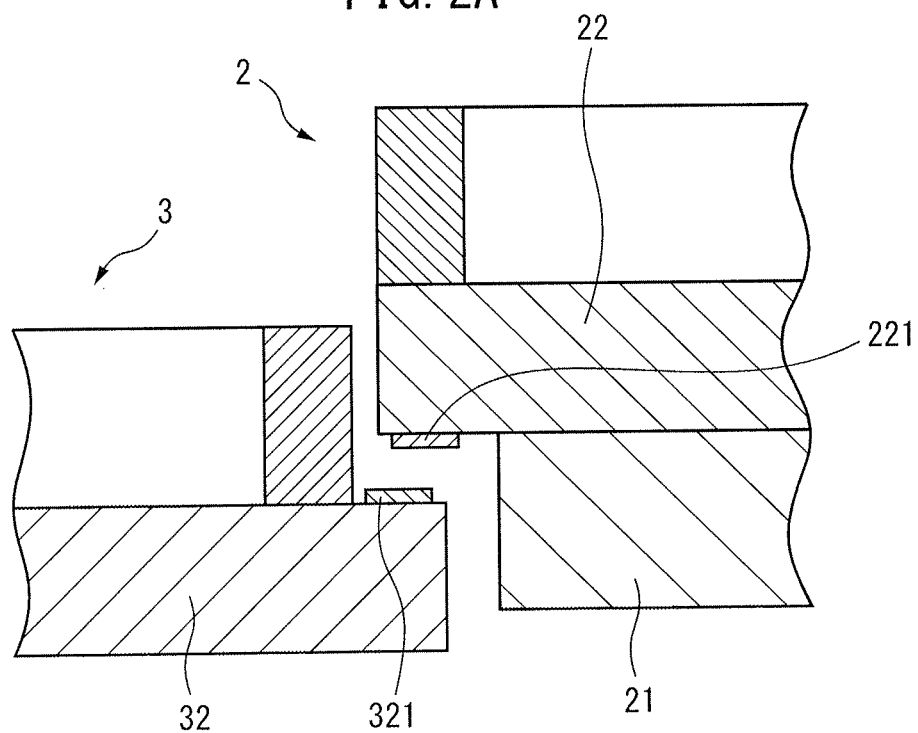
FIG. 2A is an enlarged part cross-sectional view illustrating a connection part of a central light-emitting unit 2 and a peripheral light-emitting unit 3.
Figure 2B:
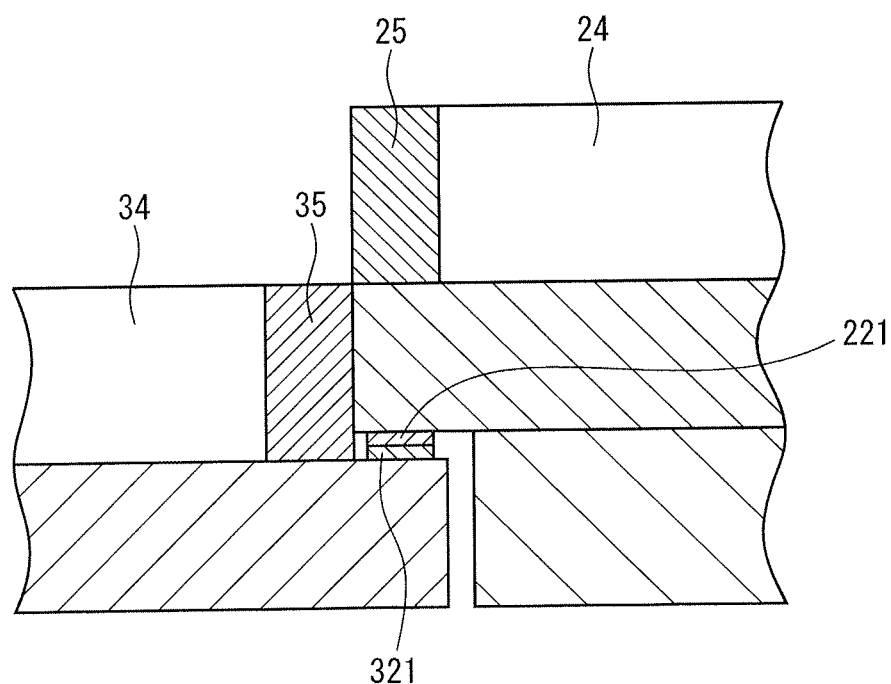
FIG. 2B is an enlarged part cross-sectional view illustrating a connection part of a central light-emitting unit 2 and a peripheral light-emitting unit 3.

FIG. 1A to FIG. 1C are a top view, an exploded view, and a cross-sectional view taken along the line IC-IC of a light-emitting device 1, respectively. In addition, FIG. 2A and FIG. 2B are enlarged part cross-sectional views illustrating a connection part of a central light-emitting unit 2 and a peripheral light-emitting unit 3.

As illustrated in FIG. 1A and FIG. 1B, the light-emitting device 1 has the central light-emitting unit 2 arranged at the center of the device, and a plurality of peripheral light-emitting units 3 arranged to surround the central light-emitting unit 2 along the outer shape thereof. The plurality of peripheral light-emitting units 3 are arranged to fill the periphery of the central light-emitting unit 2. These light-emitting units are connected to one another to form one large light-emitting region. In other words, the light-emitting device 1 achieves increase in size of a light-emitting region by connecting multiple light-emitting units that can be connected to one another. The number of the peripheral light-emitting units 3 is arbitrary, and FIG. 1A to FIG. 1C illustrate the case where the number of the peripheral light-emitting units 3 is 12.

In addition, as illustrated in FIG. 1C, the light-emitting device 1 has a metal heat dissipation substrate 4 having a regular dodecagon shape. The central light-emitting unit 2 and the 12 peripheral light-emitting units 3 are arranged on the heat dissipation substrate 4. The heat dissipation substrate 4 is made up of an aluminum material or the like, which excels in a heat resistant property and a heat dissipation property. The heat dissipation substrate 4 is not illustrated in FIG. 1A and FIG. 1B.

As major components, the central light-emitting unit 2 has a heat dissipation substrate 21, a circuit substrate 22, LED elements 23, a sealing resin 24, and a resin frame 25.

The heat dissipation substrate 21 is a metal substrate made up of an aluminum material or the like, which excels in a heat resistant property and a heat dissipation property, similarly to the heat dissipation substrate 4. The heat dissipation substrate 21 has a disc shape, and is fixed to the center of the heat dissipation substrate 4 as illustrated in FIG. 1C. Thus, in the light-emitting device 1, the central light-emitting unit 2 is arranged at a position higher than that of the peripheral light-emitting units 3. The heat dissipation substrate 21 effectively dissipates heat generated by the LED elements 23.

The circuit substrate 22 is, for example, an insulating substrate, such as a glass epoxy substrate or a ceramic substrate, and has a disc shape, similarly to the heat dissipation substrate 21. The circuit substrate 22 is attached and fixed to the upper surface of the heat dissipation substrate 21. As illustrated in FIG. 2A and FIG. 2B, for example, a connection electrode 221 for electrically connecting the central light-emitting unit 2 and each of the peripheral light-emitting units 3 is formed on the lower surface of a peripheral part of the circuit substrate 22. In the light-emitting device 1, 12 connection electrodes 221 corresponding in number to the peripheral light-emitting units 3 are arranged at regular intervals. In addition, a wiring pattern which is not illustrated is formed on the upper surface of the circuit substrate 22, and the wiring pattern is electrically connected to the connection electrodes 221. Connection electrodes for directly connecting the central light-emitting unit 2 to an external power supply may be formed on the circuit substrate 22.

The LED elements 23 are an example of light-emitting elements. In the central light-emitting unit 2, multiple LED elements 23 are arranged on the upper surface of the circuit substrate 22 at intervals therebetween, and are fixed with a transparent and insulating adhesive or the like. In addition, each LED element 23 has a pair of element electrodes on the upper surface thereof, and element electrodes of adjacent LED elements 23 are connected with each other via a bonding wire which is not illustrated. The bonding wire from an LED element 23 located on the peripheral side of the circuit substrate 22 is connected to the wiring pattern of the circuit substrate 22.

The sealing resin 24 is a colorless and transparent resin, such as an epoxy resin or a silicone resin, and integrally covers and protects the LED elements 23. A region covered with the sealing resin 24 becomes a light-emitting region of the central light-emitting unit 2. The sealing resin 24 is molded to have a disc shape, and is fixed onto the circuit substrate 22 by the resin frame 25. In addition, a phosphor is dispersed and mixed in the sealing resin 24. For example, when the LED elements 23 are blue LED elements and green LED elements, a red phosphor is dispersed and mixed in the sealing resin 24. In this case, the light-emitting device 1 emits white light obtained by mixing blue light from the blue LED elements, green light from the green LED elements, and red light obtained by exiting the red phosphor by them.

The resin frame 25 is a circular frame body made up of a white resin, for example, and fixes the sealing resin 24 onto the circuit substrate 22. The resin frame 25 reflects light emitted laterally from the LED elements 23 toward the upper side of the light-emitting device 1 (the opposite side of the circuit substrate 22 as viewed from the LED elements 23).

In addition, as major components, each of the peripheral light-emitting units 3 has a circuit substrate 32, LED elements 33, a sealing resin 34, and a resin frame 35. Although the heat dissipation substrate 4 functions as a heat dissipation substrate of each of the peripheral light-emitting units 3 in the light-emitting device 1, in place of the heat dissipation substrate 4, a heat dissipation substrate may be provided on the bottom of each of the peripheral light-emitting units 3, as a component of each of the peripheral light-emitting units 3.

The circuit substrate 32 is an insulating substrate, such as a glass epoxy substrate or a ceramic substrate. The circuit substrate 32 has a substantially trapezoidal shape which is line-symmetric with respect to the central axis such that a larger substantially circular region can be formed when the 12 peripheral light-emitting units 3 are arranged around the central light-emitting unit 2 as illustrated in FIG. 1A. However, the shape of the circuit substrate 32 (peripheral light-emitting unit 3) is not limited to that illustrated in FIG. 1A as long as a substantially circular region larger than the central light-emitting unit 2 is formed when the multiple peripheral light-emitting units 3 are connected to one another.

The circuit substrate 32 is attached and fixed to the upper surface of the heat dissipation substrate 4 around the central light-emitting unit 2. As illustrated in FIG. 2A and FIG. 2B, a connection electrode 321 is formed in the vicinity of an end part of the circuit substrate 32 on a side in contact with the central light-emitting unit 2 when the central light-emitting unit 2 and the peripheral light-emitting unit 3 are connected (hereinafter, referred to as "inner peripheral side"). In the light-emitting device 1, the circuit substrate 22 is located at a position higher than that of the circuit substrate 32 by the thickness of the heat dissipation substrate 21 of the central light-emitting unit 2. Thus, by connecting the central light-emitting unit 2 and the peripheral light-emitting unit 3, the connection electrode 221 on the lower surface of the circuit substrate 22 contacts with the connection electrode 321 on the upper surface of the circuit substrate 32, and electrical conduction between the central light-emitting unit 2 and the peripheral light-emitting unit 3 is obtained at a junction between the substrates.

On the other hand, a connection electrode 322 is formed in the vicinity of an end part of the circuit substrate 32, which is the outside (outer peripheral side) of the light-emitting device 1 when the central light-emitting unit 2 and the peripheral light-emitting unit 3 are connected. Each of the peripheral light-emitting units 3 is connected to an external power supply through the connection electrode 322. In addition, a wiring pattern which is electrically connected to the connection electrode 321 or the connection electrode 322 and is not illustrated is formed on the upper surface of the circuit substrate 32.

The LED elements 33 are an example of light-emitting elements, and also in the peripheral light-emitting units 3, similarly to the central light-emitting unit 2, multiple LED elements 33 are arranged on the upper surface of the circuit substrate 32 at intervals therebetween, and are fixed with a transparent and insulating adhesive or the like. As described below, since the area of each of the peripheral light-emitting units 3 is smaller than the area of the central light-emitting unit 2, the LED elements 33 smaller in number than the central light-emitting unit 2 are mounted on each of the peripheral light-emitting units 3. Element electrodes of each of the LED elements 33 are connected to an adjacent LED element 33 or the wiring pattern of the circuit substrate 32 with a bonding wire which is not illustrated.

Similarly to the sealing resin 24, the sealing resin 34 is a colorless and transparent resin, such as an epoxy resin or a silicone resin, and integrally covers and protects the LED elements 33. A region covered with the sealing resin 34 becomes a light-emitting region of the peripheral light-emitting unit 3. The sealing resin 34 is molded in conformity with the shape of the circuit substrate 32, and is fixed onto the circuit substrate 32 by the resin frame 35. In addition, a phosphor is dispersed and mixed also in the sealing resin 34.

The resin frame 35 is a frame body made up of a white resin, for example, in conformity with the shape of the sealing resin 34, and fixes the sealing resin 34 onto the circuit substrate 32. The resin frame 35 reflects light emitted laterally from the LED elements 33 toward the upper side of the light-emitting device 1, similarly to the resin frame 25. As illustrated in FIG. 1A and FIG. 1B, in each peripheral light-emitting unit 3 of the light-emitting device 1, the entire periphery of the sealing resin 34 is surrounded by the resin frame 35.

In the light-emitting device 1, as illustrated in FIG. 1A, the sealing resin 24 of the central light-emitting unit 2 has a disc shape, and the sealing resins 24 and 34 in a region filled with the central light-emitting unit 2 and the plurality of peripheral light-emitting units 3 have a disc shape as a whole. This is because the shape of a light-emitting region is preferably a circular shape in considering that a light-emitting device is used for an actual lighting apparatus or the like. For example, a reflector of a lighting apparatus is often made on the premise of a circular light-emitting region, and thus, when the shape of a light-emitting region is as close to a circular shape as possible, the reflection efficiency in the reflector is improved. However, the resin region of the central light-emitting unit 2 and the resin region of the light-emitting device 1 as a whole may have polygonal shapes close to the circle, such as a hexagonal shape and an octagonal shape, and do not need to have a perfect circle shape.

In addition, in the light-emitting device 1, as illustrated in FIG. 1A and FIG. 1B, the resin region of one peripheral light-emitting unit 3 is smaller than the resin region of the central light-emitting unit 2. This is because the central light-emitting unit 2 is preferably manufactured as large as possible within the range where the quality of the central light-emitting unit 2 is ensured, since the central part, which is an optical axis, needs to be brightened for the purpose of illumination. When the area of the central light-emitting unit 2 is maximized within the range where the quality is ensured, the area of each of the peripheral light-emitting units 3 is equal to or smaller than the area of the central light-emitting unit 2. Therefore, it is preferable that the sealing resin 34 of each of the peripheral light-emitting units 3 have an area equal to or smaller than that of the sealing resin 24 of the central light-emitting unit 2.

In addition, in the light-emitting device 1, the plurality of peripheral light-emitting units 3 may include those having different emission colors. For example, in one light-emitting device, a peripheral light-emitting unit 3 having a color temperature of the emission color of 4000 K, a peripheral light-emitting unit 3 of 5000 K, and the like, which are different in color shade, may be included. For this purpose, for example, the type and the composition (combination) of the phosphor mixed in the sealing resin 34 of each peripheral light-emitting unit 3 may be changed, or the ratio of the number of the blue LED elements that emit blue light to the number of the green LED elements that emit green light may be changed for each peripheral light-emitting unit 3. In this case, for example, the peripheral light-emitting units 3 having different emission colors are connected in parallel to an external power supply, and power supply systems of the peripheral light-emitting units 3 are separated by color, so that the peripheral light-emitting units 3 with all colors can be made to emit light to mix colors of the lights, or only the peripheral light-emitting units 3 with a certain color can be made to emit light. In this manner, in the light-emitting device 1, the color rendering property can be improved by freely adjusting the color shade or the amount of light as a whole, depending on the intended purpose.

Figure 3A:
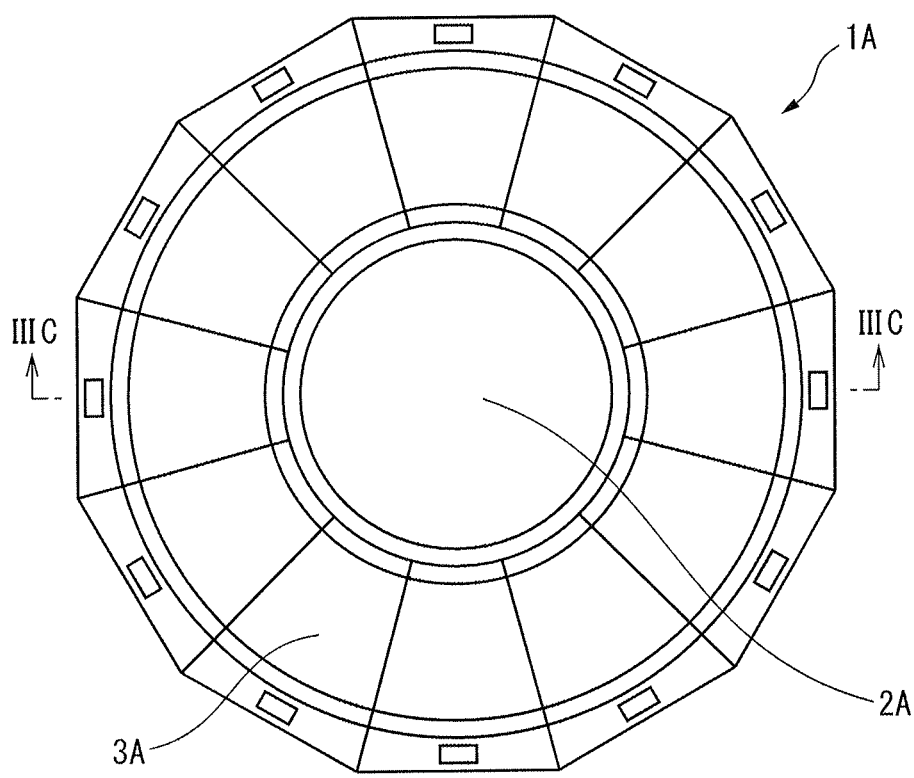
FIG. 3A is a top view of a light-emitting device 1A.
Figure 3B:
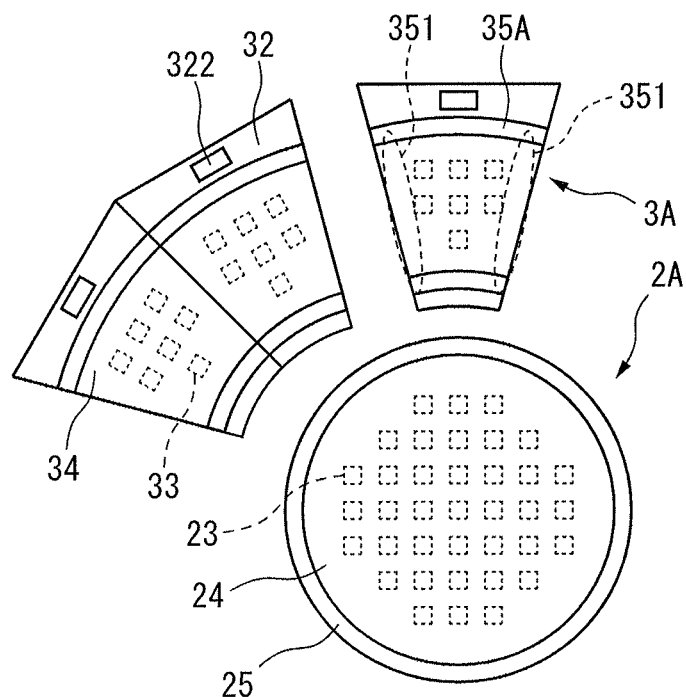
FIG. 3B is an exploded view of a light-emitting device 1A.
Figure 3C:
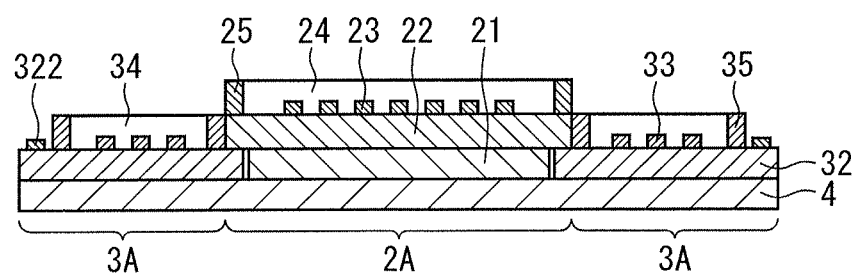
FIG. 3C is a cross-sectional view taken along the line IIIC-IIIC of a light-emitting device 1A.

FIG. 3A to FIG. 3C are a top view, an exploded view, and a cross-sectional view taken along the line IIIC-IIIC of a light-emitting device 1A, respectively. The light-emitting device 1A has a central light-emitting unit 2A, a plurality of peripheral light-emitting units 3A arranged around it, and a heat dissipation substrate 4. The structure of the light-emitting device 1A is the same as the structure of the light-emitting device 1 illustrated in FIG. 1A to FIG. 1C, except for the shape of a resin frame 35A of each peripheral light-emitting unit 3A. Thus, the same reference numerals are used for corresponding components, and the duplicated description will be omitted.

As illustrated in FIG. 3A and FIG. 3E, in the light-emitting device 1A, the resin frame 35A of each of the peripheral light-emitting units 3A is not provided on side end parts 351 that face adjacent peripheral light-emitting units 3A when the central light-emitting unit 2A and the plurality of peripheral light-emitting units 3A are connected. Thus, the light-emitting device 1A includes a region covered with the sealing resin 34 wider than that of the light-emitting device 1 by the side end parts 351, and thus the area of the light-emitting region of the light-emitting device 1A is larger. In addition, in the light-emitting device 1A, there is no resin frame 35A between adjacent peripheral light-emitting units 3A, and thus, emission colors from the plurality of peripheral light-emitting units 3A are easily mixed compared to the light-emitting device 1. Since the degree of mixing the colors can be changed by the presence or absence of the resin frame, in the light-emitting device 1A, the color rendering property can be more improved by appropriately adjusting the emission colors of the respective peripheral light-emitting units 3A.

Figure 4A:
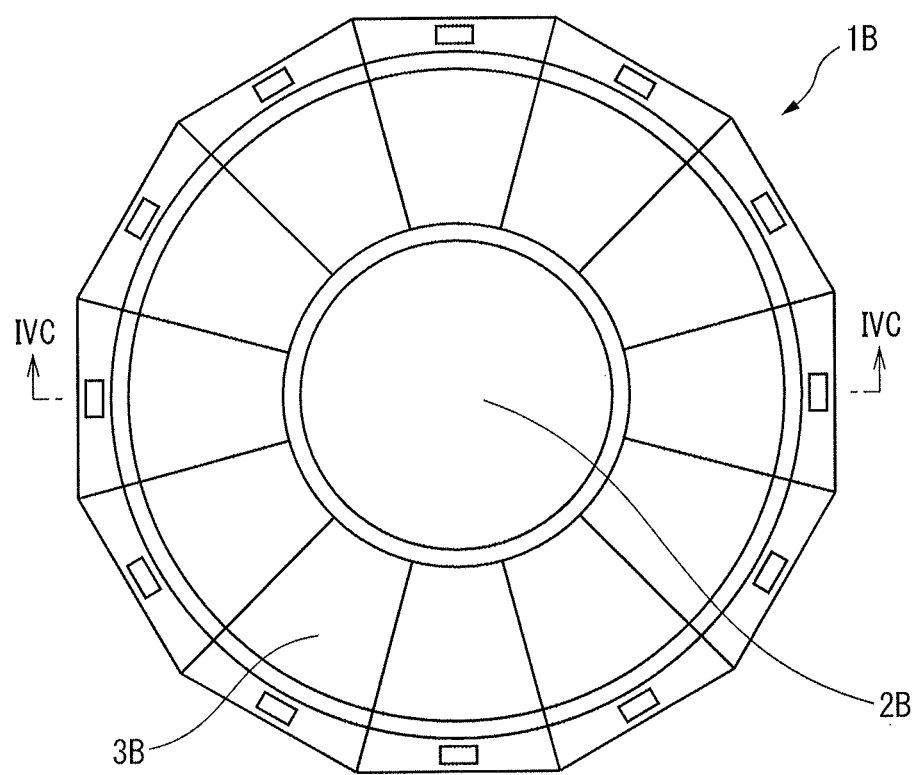
FIG. 4A is a top view of a light-emitting device 1B.
Figure 4B:
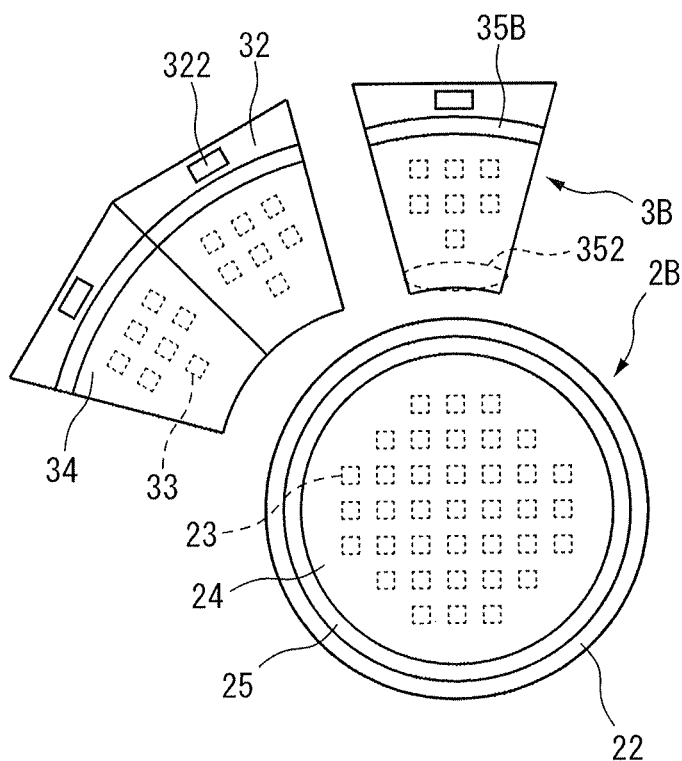
FIG. 4B is an exploded view of a light-emitting device 1B.
Figure 4C:
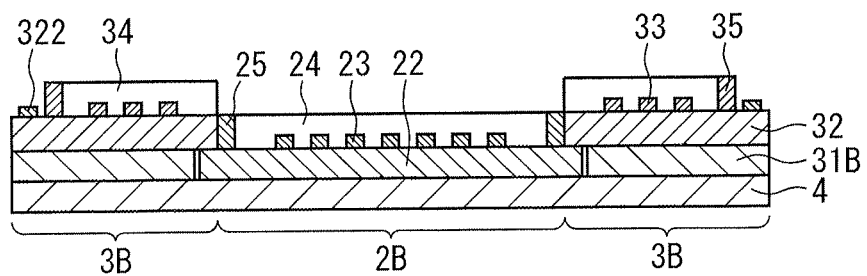
FIG. 4C is a cross-sectional view taken along the line IVC-IVC of a light-emitting device 1B.

FIG. 4A to FIG. 4C are a top view, an exploded view, and a cross-sectional view taken along the line IVC-IVC of a light-emitting device 1B, respectively. The light-emitting device 1B has a central light-emitting unit 2B, a plurality of peripheral light-emitting units 3B arranged around it, and a heat dissipation substrate 4. The structure of the light-emitting device 1B is the same as the structure of the light-emitting device 1 illustrated in FIG. 1A to FIG. 1C, except that the central light-emitting unit 2B has no heat dissipation substrate, each peripheral light-emitting unit 3B has a heat dissipation substrate 31B on the bottom thereof, and the shape of a resin frame 35B of each peripheral light-emitting unit 3B is different. Thus, the same reference numerals are used for corresponding components, and the duplicated description will be omitted.

As illustrated in FIG. 4A and FIG. 4B, in the light-emitting device 1B, the resin frame 35B of each of the peripheral light-emitting units 3B is not provided also on an inner peripheral side end part 352 that faces the central light-emitting unit 2B as well as the side end parts that face adjacent peripheral light-emitting units 3B. Thus, in the light-emitting device 1B, the area of the light-emitting region is larger by the inner peripheral side end part 352, and emission colors from the central light-emitting unit 2B and the plurality of peripheral light-emitting units 3B are further easily mixed compared to the light-emitting device 1A.

In addition, as illustrated in FIG. 4C, in the light-emitting device 1B, contrary to the light-emitting devices 1 and 1A, the circuit substrates 32 are located at a position higher than that of the circuit substrate 22 by the thickness of the heat dissipation substrates 31B of the peripheral light-emitting units 3B. In the light-emitting device 1B, there is no resin frame 35B on the inner peripheral side end part 352 of each peripheral light-emitting unit 3B, and thus, when the height of the central light-emitting unit 2B is lowered, light from each of the peripheral light-emitting units 3B is also laterally emitted toward the central light-emitting unit 2B. Therefore, in this regard also, in the light-emitting device 1B, the emission colors from the respective light-emitting units are further easily mixed compared to the light-emitting device 1A.

As the light-emitting devices 1, 1A, and 1B, the LED elements 23 of the central light-emitting units 2, 2A, and 2B and the LED elements 33 of the plurality of peripheral light-emitting units 3, 3A, and 3B may be mounted on the circuit substrates 22 and 32 at relatively different heights. Alternatively, all of the LED elements 23 and 33 may be mounted at the same height. In addition, two or all types among the peripheral light-emitting unit 3 which has a resin frame on four sides, the peripheral light-emitting unit 3A which does not have a resin frame on the side end parts 351, and the peripheral light-emitting unit 3B which does not have a resin frame also on the inner peripheral side end part 352, may be mixed in one light-emitting device, depending on the intended purpose. Alternatively, regarding the central light-emitting units 2, 2A, and 2B, the resin frame 25 may be removed, or the resin frame 25 may be provided on only a part of the periphery of the sealing resin 24. The degree of mixing the emission colors can be appropriately changed depending on the heights of the central light-emitting unit and the peripheral light-emitting units, and the presence or absence of the resin frames.

FIG. 5A to FIG. 5D are cross-sectional views of light-emitting devices 1C to 1F, respectively. In these drawings, a longitudinal section passing through the center of each of the light-emitting devices is illustrated, similarly to FIG. 1C and the like. The light-emitting devices 1C to 1F also have the same structure as the light-emitting devices 1, 1A, and 1B described above, and the duplicated description will be omitted.

Figure 5A:
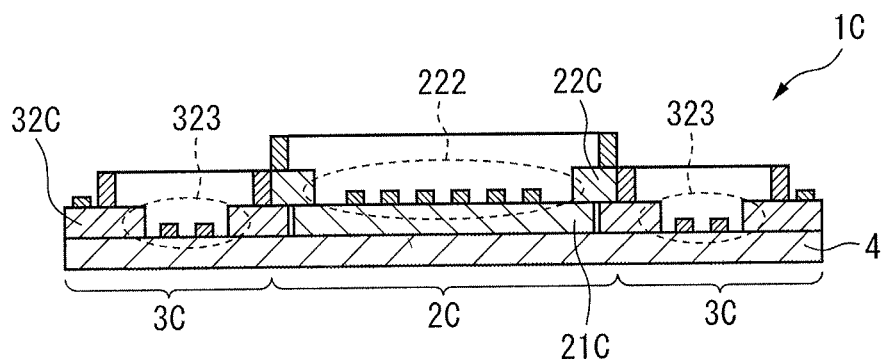
FIG. 5A is a cross-sectional view of a light-emitting device 1C.
Figure 5B:
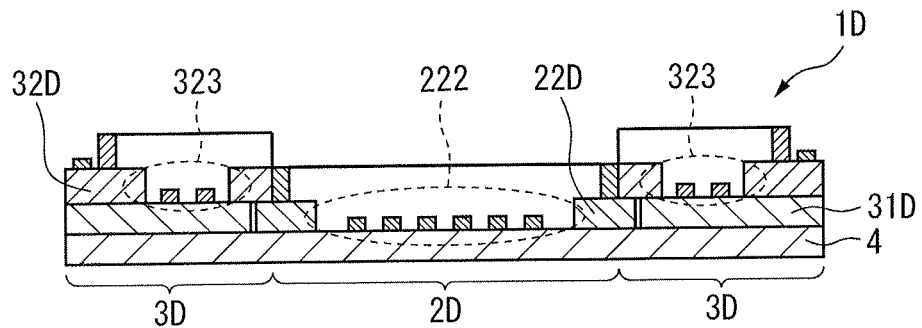
FIG. 5B is a cross-sectional view of a light-emitting device 1D.

The light-emitting device 1C illustrated in FIG. 5A is a light-emitting device similar to the light-emitting devices 1 and 1A, but, in the light-emitting device 1C, a circuit substrate 22C of a central light-emitting unit 2C and a circuit substrate 32C of each of peripheral light-emitting units 3C have through holes 222 and 323, respectively, and LED elements are directly mounted on heat dissipation substrates 21C and 4. In addition, the light-emitting device 1D illustrated in FIG. 5B is a light-emitting device similar to the light-emitting device 1B, but, in the light-emitting device 1D, a circuit substrate 22D of a central light-emitting unit 2D and a circuit substrate 32D of each of peripheral light-emitting units 3D have through holes 222 and 323, respectively, and LED elements are directly mounted on heat dissipation substrates 4 and 31D. In this manner, the respective LED elements may be directly mounted on the metallic heat dissipation substrates to further improve the heat dissipation property.

Figure 5C:
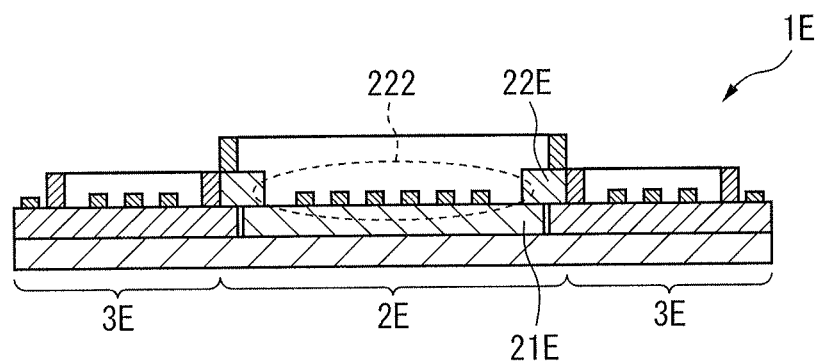
FIG. 5C is a cross-sectional view of a light-emitting device 1E.
Figure 5D:
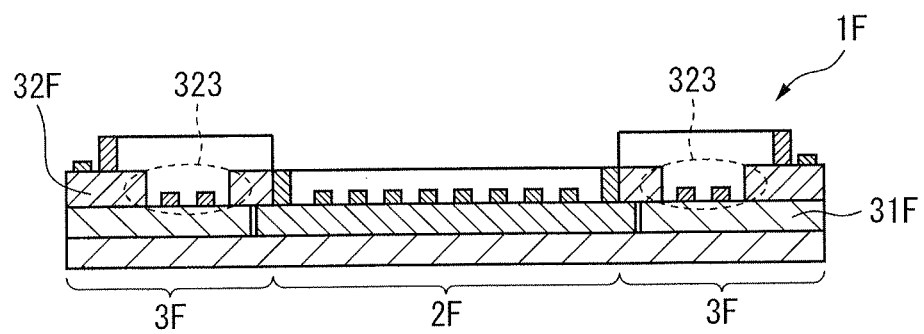
FIG. 5D is a cross-sectional view of a light-emitting device 1F.

The light-emitting device 1E illustrated in FIG. 5C is a light-emitting device similar to the light-emitting devices 1 and 1A, but, in the light-emitting device 1E, only a circuit substrate 22E of a central light-emitting unit 2E has a through hole 222, and LED elements of the central light-emitting unit 2E are directly mounted on a heat dissipation substrate 21E. In addition, the light-emitting device 1F illustrated in FIG. 5D is a light-emitting device similar to the light-emitting device 1B, but, in the light-emitting device 1F, only a circuit substrate 32F of each of peripheral light-emitting units 3F has a through hole 323, and LED elements of the peripheral light-emitting unit 3F are directly mounted on a heat dissipation substrate 31F. In this manner, light-emitting units in each of which a circuit substrate has a through hole and light-emitting units in each of which a circuit substrate does not have a through hole may be mixed. In this case, from the view point of the heat dissipation property, it is preferable that LED elements having a relatively high amount of heat generation be arranged in light-emitting units having a through hole, and that LED elements having a relatively low amount of heat generation be arranged in light-emitting units having no through hole. In a plurality of peripheral light-emitting units, light-emitting units in each of which a circuit substrate has a through hole and light-emitting units in each of which a circuit substrate has no through hole may be mixed.

In the light-emitting devices described above, one large substantially circular (disc-shaped) light-emitting region is formed by a central light-emitting unit arranged at the center of the device and a plurality of peripheral light-emitting units arranged to surround the central light-emitting unit along the outer shape thereof. In other words, in these light-emitting devices, by connecting multiple light-emitting units that can be connected to one another, the light-emitting region can be increased in size without decreasing the yield, and the amount of light of the central part can be increased.

According to the foregoing light-emitting devices, various module structures as light-emitting devices are possible by changing the number and the shape of peripheral light-emitting units to be combined, the connecting method, and the like. In particular, since individual light-emitting unit is one package, an entire circuit can be structured by freely combining the light-emitting units in parallel or in series. On this occasion, by increasing the number of the light-emitting units connected in series, the variation in the intensity of light due to the variation in the VF (forward voltage) of LED elements included in each of the light-emitting units can be suppressed.

In addition, in the above-described light-emitting devices, the emission color can be changed for each light-emitting unit, and thus, the color rendering property can also be improved. Since multiple light-emitting regions having relatively small areas are combined, the variation in the emission color, which can be generated when one light-emitting region is increased in size, is suppressed, and the chromaticity defect can be reduced. In addition, although sink marks become easily generated as the area of a resin region becomes larger, in the above-described light-emitting devices, multiple light-emitting regions having small areas are combined, and thus, the generation of sink marks on the upper surface of a sealing resin in each light-emitting unit can be suppressed.

In addition, when a ceramic substrate is used as a circuit substrate, by making the area thereof large, the circuit substrate becomes easy to be broken due to heat generation of LED elements. However, in the above-described light-emitting devices, the area of individual light-emitting unit is relatively small, and thus, there is the advantage that the circuit substrate becomes difficult to be broken even when a ceramic substrate is used.

In addition, although peripheral light-emitting units are arranged to surround the circumference of a central light-emitting unit singly in all of the above-described examples, a larger light-emitting region can be formed by arranging the peripheral light-emitting units at the circumference of the central light-emitting unit doubly or triply.

The invention claimed is:
1. A light-emitting device comprising:
a central light-emitting unit having a disc-shaped light-emitting region; and
a plurality of peripheral light-emitting units arranged at regular intervals in a circumferential direction of the central light-emitting unit to fill a periphery of the central light-emitting unit, each of the peripheral light-emitting units having a substantially trapezoidal-shaped light-emitting region,
wherein
each of the central light-emitting unit and the peripheral light-emitting units includes a circuit substrate on an upper surface or lower surface of whose end part a connection electrode is formed, and light-emitting elements electrically connected to the circuit substrate,
an area of the light-emitting region of each of the peripheral light-emitting units is equal to or smaller than an area of the light-emitting region of the central light-emitting unit,
the number of the light-emitting elements of each of the peripheral light-emitting units is smaller than the number of the light-emitting elements of the central light-emitting unit,
an amount of light of the central light-emitting unit is larger than an amount of light of each of the peripheral light-emitting units,
the end parts of the circuit substrate of the central light-emitting unit and the circuit substrates of the plurality of peripheral light-emitting units vertically overlap with each other, so that the connection electrodes are directly in contact with each other to obtain electrical conduction between the central light-emitting unit and the plurality of peripheral light-emitting units, and an end part of the light-emitting region of each of the peripheral light-emitting units on a side of the central light-emitting unit is adjacent to the light-emitting region of the central light-emitting unit, so that one substantially disc-shaped light-emitting region is formed by the central light-emitting unit and the plurality of peripheral light-emitting units,
the central light-emitting unit further includes a heat dissipation substrate arranged below the circuit substrate,
the heat dissipation substrate is smaller than the circuit substrate of the central light-emitting unit by an overlapped region between the circuit substrate of the central light-emitting unit and the circuit substrates of the plurality of peripheral light-emitting units, and
the circuit substrate of the central light-emitting unit is located at a position higher than a position of the circuit substrates of the plurality of peripheral light-emitting units by a thickness of the heat dissipation substrate.
2. The light-emitting device according to claim 1, wherein the plurality of peripheral light-emitting units includes peripheral light-emitting units having different emission color.
3. The light-emitting device according to claim 2, wherein the peripheral light-emitting units having the different emission colors are connected in parallel to an external power supply.
4. The light-emitting device according to claim 1, wherein each of the central light-emitting unit and the peripheral light-emitting units further includes a sealing resin that seals the light-emitting elements, and a resin frame that fixes the sealing resin,
the light-emitting region of the central light-emitting unit is a region covered with the sealing resin of the central light-emitting unit, and
the light-emitting region of each of the peripheral light-emitting units is a region covered with the sealing resin of the peripheral light-emitting unit.
5. The light-emitting device according to claim 4, wherein the resin frame of each of the peripheral light-emitting units is not provided on end parts that face adjacent peripheral light-emitting units.
6. The light-emitting device according to claim 5, wherein the resin frame of each of the peripheral light-emitting units is not provided also on an end part that faces the central light-emitting unit.
7. The light-emitting device according to claim 1, wherein each of the central light-emitting unit and the peripheral light-emitting units includes a ceramic circuit substrate as the circuit substrate.

8. The light-emitting device according to claim 1, wherein the light-emitting elements of the central light-emitting unit and the light-emitting elements of the plurality of peripheral light-emitting units are mounted on the circuit substrates at relatively different heights.

9. The light-emitting device according to claim 1, wherein
the circuit substrate of the central light-emitting unit includes a through hole, and
the light-emitting elements of the central light-emitting unit are directly mounted on the heat dissipation substrate exposed by the through hole.

10. The light-emitting device according to claim 9 further comprising an entire heat dissipation substrate arranged below the central light-emitting unit and the plurality of peripheral light-emitting units, wherein
the circuit substrates of the plurality of peripheral light-emitting units include through holes, respectively, and
the light-emitting elements of the plurality of peripheral light-emitting units are directly mounted on the entire heat dissipation substrate exposed by the through holes.

11. A light-emitting device comprising:
a central light-emitting unit having a disc-shaped light-emitting region; and
a plurality of peripheral light-emitting units arranged at regular intervals in a circumferential direction of the central light-emitting unit to fill a periphery of the central light-emitting unit, each of the peripheral light-emitting units having a substantially trapezoidal-shaped light-emitting region,
wherein
each of the central light-emitting unit and the peripheral light-emitting units includes a circuit substrate on an upper surface or lower surface of whose end part a connection electrode is formed, and light-emitting elements electrically connected to the circuit substrate,
an area of the light-emitting region of each of the peripheral light-emitting units is equal to or smaller than an area of the light-emitting region of the central light-emitting unit,
the number of the light-emitting elements of each of the peripheral light-emitting units is smaller than the number of the light-emitting elements of the central light-emitting unit,
an amount of light of the central light-emitting unit is larger than an amount of light of each of the peripheral light-emitting units,
the end parts of the circuit substrate of the central light-emitting unit and the circuit substrates of the plurality of peripheral light-emitting units vertically overlap with each other, so that the connection electrodes are directly in contact with each other to obtain electrical conduction between the central light-emitting unit and the plurality of peripheral light-emitting units, and an end part of the light-emitting region of each of the peripheral light-emitting units on a side of the central light-emitting unit is adjacent to the light-emitting region of the central light-emitting unit, so that one substantially disc-shaped light-emitting region is formed by the central light-emitting unit and the plurality of peripheral light-emitting units,
the peripheral light-emitting units further include heat dissipation substrates arranged below the circuit substrates, respectively,
the heat dissipation substrates are smaller than the circuit substrates of the plurality of peripheral light-emitting units by overlapped regions between the circuit substrate of the central light-emitting unit and the circuit substrates of the plurality of peripheral light-emitting units, and
the circuit substrates of the plurality of peripheral light-emitting units are located at a position higher than a position of the circuit substrate of the central light-emitting unit by a thickness of the heat dissipation substrates.

12. The light-emitting device according to claim 11, wherein
the circuit substrates of the plurality of peripheral light-emitting units include through holes, respectively, and
the light-emitting elements of the plurality of peripheral light-emitting units are directly mounted on the heat dissipation substrates exposed by the through holes.

13. The light-emitting device according to claim 12 further comprising an entire heat dissipation substrate arranged below the central light-emitting unit and the plurality of peripheral light-emitting units, wherein
the circuit substrate of the central light-emitting unit includes a through hole, and
the light-emitting elements of the central light-emitting unit are directly mounted on the entire heat dissipation substrate exposed by the through hole.

14. The light-emitting device according to claim 11, wherein the plurality of peripheral light-emitting units includes peripheral light-emitting units having different emission color.

15. The light-emitting device according to claim 14, wherein the peripheral light-emitting units having the different emission colors are connected in parallel to an external power supply.

16. The light-emitting device according to claim 11, wherein
each of the central light-emitting unit and the peripheral light-emitting units further includes a sealing resin that seals the light-emitting elements, and a resin frame that fixes the sealing resin,
the light-emitting region of the central light-emitting unit is a region covered with the sealing resin of the central light-emitting unit, and
the light-emitting region of each of the peripheral light-emitting units is a region covered with the sealing resin of the peripheral light-emitting unit.

17. The light-emitting device according to claim 16, wherein the resin frame of each of the peripheral light-emitting units is not provided on end parts that face adjacent peripheral light-emitting units.

18. The light-emitting device according to claim 17, wherein the resin frame of each of the peripheral light-emitting units is not provided also on an end part that faces the central light-emitting unit.

19. The light-emitting device according to claim 11, wherein each of the central light-emitting unit and the peripheral light-emitting units includes a ceramic circuit substrate as the circuit substrate.

20. The light-emitting device according to claim 11, wherein the light-emitting elements of the central light-emitting unit and the light-emitting elements of the plurality of peripheral light-emitting units are mounted on the circuit substrates at relatively different heights.

* * * * *